United States Patent [19]
Kobayashi et al.

[11] Patent Number: 5,483,918
[45] Date of Patent: Jan. 16, 1996

[54] METHOD FOR PRODUCING SINGLE-CRYSTAL SILICON BY CHEMICAL VAPOR DEPOSITION AND METHOD FOR FRACTIONAL DETERMINATION OF ULTRATRACE ELEMENTS PRESENT IN CHLOROSILANES AS STARTING MATERIALS AND SINGLE-CRYSTAL SILICON PRODUCED

[75] Inventors: Yoji Kobayashi; Yasuhide Nishina; Shuichi Miyao, all of Niigata, Japan

[73] Assignee: Shin-Etsu Chemical Co., Ltd., Tokyo, Japan

[21] Appl. No.: 225,907

[22] Filed: Apr. 11, 1994

Related U.S. Application Data

[62] Division of Ser. No. 834,647, Feb. 12, 1992, abandoned.

[30] Foreign Application Priority Data

Feb. 14, 1991 [JP] Japan ..................... 3-020652

[51] Int. Cl.$^6$ .................................. C30B 25/02
[52] U.S. Cl. ................ 117/84; 23/295 R; 117/92
[58] Field of Search ................ 23/295 R; 117/84, 117/88, 92, 97, 904, 935; 437/91, 173

[56] References Cited

U.S. PATENT DOCUMENTS

| | | | |
|---|---|---|---|
| 4,234,355 | 11/1980 | Meinders | 437/11 |
| 4,415,373 | 11/1983 | Pressley | 437/11 |
| 4,679,308 | 7/1987 | Finn et al. | 437/11 |

FOREIGN PATENT DOCUMENTS

| | | |
|---|---|---|
| 62-33417 | 2/1987 | Japan . |
| 0311727 | 1/1991 | Japan . |
| 0360026 | 3/1991 | Japan . |

*Primary Examiner*—R. Bruce Breneman
*Assistant Examiner*—Felisa Garrett
*Attorney, Agent, or Firm*—McAulay Fisher Nissen Goldberg & Kiel

[57] ABSTRACT

A silicon single crystal for use as semiconductor is grown by supplying, to a seed rod of single-crystal silicon, hydrochloride gas and silicon formed by admixing at least one chlorosilane gas selected from the group consisting of dichlorosilane, trichlorosilane and tetrachlorosilane with hydrogen gas at a high temperature to grow single-crystal silicon on the seed rod while etching the growing single-crystal silicon with the hydrochloride gas. The silicon single crystal is irradiated with laser rays so that the energy of the laser rays on the irradiated surface of the crystal ranges from 3100 to 3358 mW/cm$^2$ and then spectra emitted by the crystal are optoelectrically determined to quantify the ultratrace elements present in the silicon single crystal. Moreover, the amounts of these ultratrace elements are reduced to those of ultratrace elements present in the chlorosilane gas.

2 Claims, 1 Drawing Sheet

FIG. 1
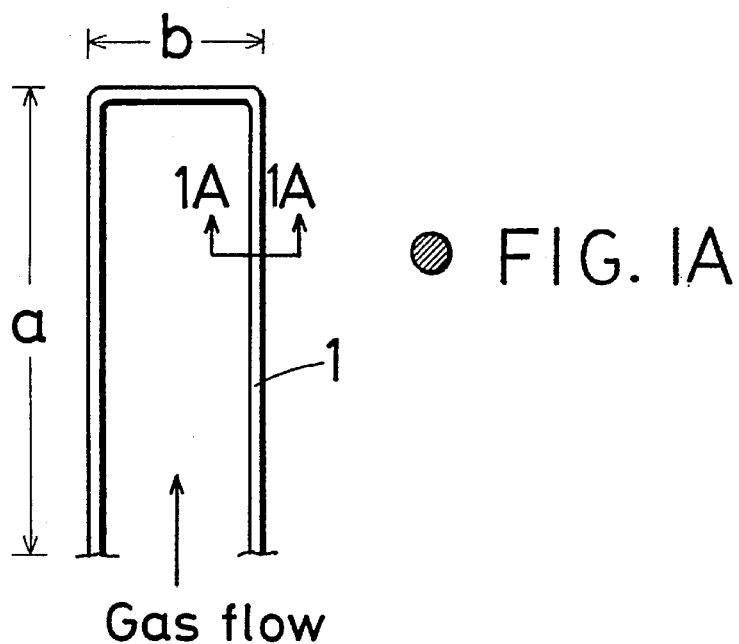
FIG. 1A
Gas flow
FIG. 2
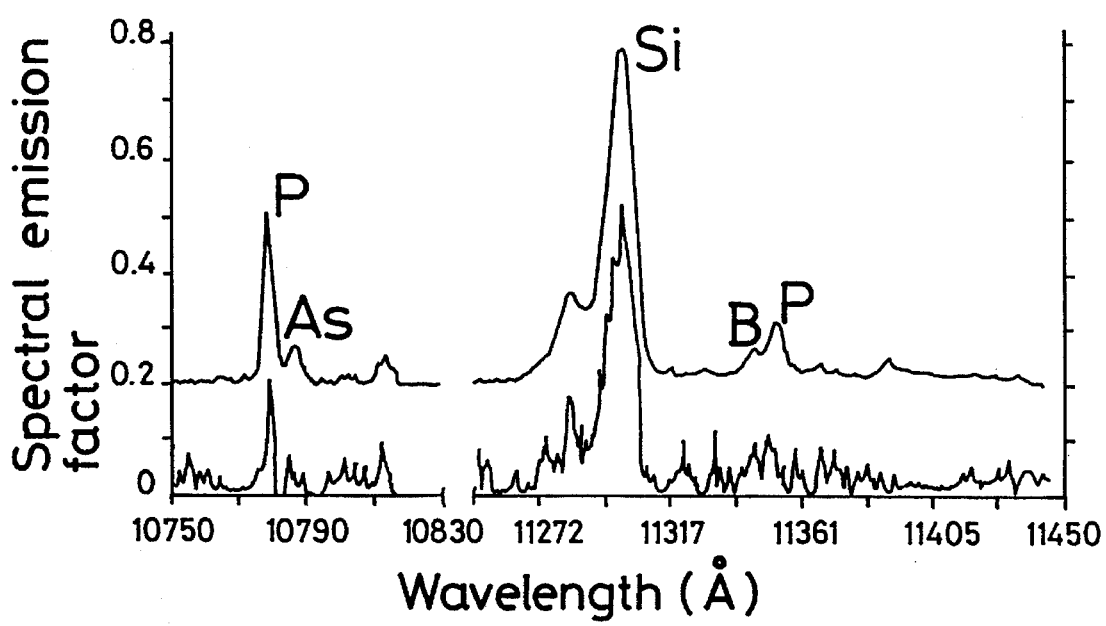

METHOD FOR PRODUCING SINGLE-CRYSTAL SILICON BY CHEMICAL VAPOR DEPOSITION AND METHOD FOR FRACTIONAL DETERMINATION OF ULTRATRACE ELEMENTS PRESENT IN CHLOROSILANES AS STARTING MATERIALS AND SINGLE-CRYSTAL SILICON PRODUCED

This is a Division, of application Ser. No. 07/834,647 filed Feb. 12, 1992 now abandoned.

BACKGROUND OF THE INVENTION

The present invention relates to a method for the production of a silicon single crystal used as a semiconductor by the chemical vapor deposition technique and a method for the fractional determination of ultratrace elements (such as phosphorus, arsenic, boron and aluminum) present in chlorosilanes as starting materials for the production of the silicon single crystal and the resulting silicon single crystal.

To produce a silicon single crystal for use as a semiconductor by the chemical vapor deposition technique, a starting material such as chlorosilanes or monosilane is supplied to a solid phase comprising a polycrystalline silicon seed held in a growth chamber while heating the starting material together with a reducing component such as hydrogen gas to grow a polycrystalline silicon crystal on the polycrystalline silicon seed, then the grown polycrystalline silicon crystal is withdrawn from the growth chamber and the polycrystalline silicon is converted into a silicon single crystal according to the floating zone melting method (FZ method). Silicon semiconductor wafers are produced from the silicon single crystal thus produced.

The silicon single crystal thus produced comprises, as impurities, ultratrace elements such as phosphorus, arsenic, boron and aluminum which have been included in the chlorosilanes used as the starting material. Electrical properties of the resulting semiconductor are greatly affected by these impurities. For this reason, the accurate fractional determination of these ultratrace elements present in silicon single crystals are closely related to the quantitative determination of ultratrace elements in starting materials and is quite important for evaluating the electrical properties of the resulting semiconductor.

Method F574–83 of the American Society for Testing and Materials (ASTM) is a method for determining the amounts of trace elements present in silicon crystals for semiconductors. This method comprises producing a silicon polycrystal according to the chemical vapor deposition technique, converting the resulting polycrystal into a silicon single crystal according to the floating zone melting method, determining the specific resistance of the single crystal, then repeating several times the floating zone melting procedures under vacuum to remove donors (phosphorus and arsenic) and again determining the specific resistance of the single crystal to evaluate the concentration of the sum of the remaining acceptors (boron and aluminum). The concentration of the sum of phosphorus and arsenic can be calculated on the basis of the total concentration of the acceptors and the difference between the specific resistances as determined above.

However, the silicon single crystal conventionally obtained by the combination of the chemical vapor deposition and floating zone melting methods would possibly be contaminated by the floating zone melting apparatus per se and accordingly it is difficult to obtain silicon single crystals having sufficient high purity. Moreover, the floating zone reel ting method requires complicated operations, skill in the operator while taking a long time period to obtain a silicon single crystal.

Further, the foregoing conventional method for determining the amounts of trace elements suffers from the following problems and is improper for quantitative determination of ultratrace elements in which highly accurate measurement is required. First of all, the concentrations of ultratrace elements present in the silicon polycrystal grown according to the chemical vapor deposition technique often differs from lot to lot. If silicon polycrystals are continuously treated in the floating zone melting apparatus to give single crystals, the concentration of the trace elements present in the silicon polycrystal previously treated to convert a single crystal, would greatly affect the silicon polycrystal subsequently treated by the apparatus. Moreover, phosphorus, arsenic and boron cause segregation in the direction along which the floating zone melting method is performed. Accordingly, the practical concentration of these trace elements should be determined while taking the influence of the segregation into consideration. In addition, the specific resistance becomes great when the amount of trace elements is extremely small and in the worst case, for instance, if the specific resistance is greater than about 5000$\Omega \cdot$ cm, Joulean heat is generated which leads to an error in the measurement of specific resistance. Finally, the foregoing method does not give the concentration of each individual trace element, but gives the concentration of the sum of phosphorus and arsenic and that of the sum of boron and aluminum.

SUMMARY OF THE INVENTION

Accordingly, a first object of the present invention is to provide a method for directly producing a silicon single crystal for a semiconductor through the chemical vapor deposition technique without using the floating zone melting method. The first object of the present invention can be achieved by providing a method for producing a silicon single crystal which comprises supplying, to a seed rod of single-crystal silicon, hydrochloride gas and silicon formed by admixing at least one chlorosilane gas selected from the group consisting of dichlorosilane, trichlorosilane and tetrachlorosilane with hydrogen gas at a high temperature to thus grow single-crystal silicon on the seed rod while etching the growing single crystal silicon with the hydrochloride gas.

A second object of the present invention is to provide a method for the fractional determination of ultratrace elements (such as phosphorus, arsenic, boron and aluminum) present in a silicon single crystal produced according to the chemical vapor deposition technique. The second object of the present invention can be achieved by providing a method for the fractional determination of ultratrace elements which comprises the steps of irradiating a silicon single crystal produced according to the chemical vapor deposition technique with laser rays so that the energy of the laser rays on the irradiated surface of the crystal ranges from 3100 to 3358 mW/cm$^2$ and then optoelectrically determining the spectra emitted by the crystal to thus quantify the ultratrace elements present in the silicon single crystal.

A third object of the present invention is to provide a method for the fractional determination of ultratrace elements (such as phosphorus, arsenic, boron and aluminum) present in chlorosilanes used as starting materials for producing a silicon single crystal through the chemical vapor deposition technique. The third object of the present invention can be achieved by providing a method for the fractional determination of such ultratrace elements present in the chlorosilane which comprises the steps of irradiating, with laser rays, a silicon single crystal produced by a method which comprises the step of supplying, to a seed rod of single-crystal silicon, hydrochloride gas and silicon formed by admixing at least one chlorosilane gas selected from the group consisting of dichlorosilane, trichlorosilane and tetrachlorosilane with hydrogen gas at a high temperature to thus grow single-crystal silicon on the seed rod while etching the growing single crystal silicon with the hydrochloride gas so that the energy of the laser rays on the irradiated surface of the crystal ranges from 3100 to 3358 mW/cm$^2$, then optoelectrically determining spectra emitted by the crystal to thus quantify the ultratrace elements present in the silicon single crystal and reduce the amount of the ultratrace elements thus determined to that of the elements present in the chlorosilane gas.

BRIEF EXPLANATION OF THE DRAWINGS

FIG. 1 is a schematic diagram illustrating a structure for holding a rod 1 of silicon single crystal; and FIG. 2 is a spectral chart observed when a silicon single crystal is irradiated with laser rays.

DETAILED EXPLANATION OF THE INVENTION

When the chlorosilane gas used in the starting gas mixture is dichlorosilane, preferably the amount of dichlorosilane ranges from 5.0 to 5.5 mole % on the basis of the total amount of the dichlorosilane/hydrogen gas mixture; the flow rate of the sum of dichlorosilane and hydrogen gas ranges from 800 to 850 l/hr; and the temperature of the starting mixed gas ranges from 1250° to 1280° C. However, when the chlorosilane gas used in the starting gas mixture is trichlorosilane, preferably the amount of trichlorosilane ranges from 9.0 to 9.5 mole % on the basis of the total amount of the trichlorosilane/hydrogen gas mixture; the flow rate of the sum of trichlorosilane and hydrogen gas ranges from 960 to 990 l/hr.; and the temperature of the starting mixed gas ranges from 1200° to 1250° C. Further, when the chlorosilane gas used in the starting gas mixture is tetrachlorosilane, preferably the amount of tetrachlorosilane ranges from 12.0 to 12.5 mole % on the basis of the total amount of the tetrachlorosilane/hydrogen gas mixture; the flow rate of the sum of tetrachlorosilane and hydrogen gas ranges from 1100 to 1150 l/hr.; and the temperature of the starting mixed gas ranges from 1150 to 1200° C.

The chlorosilane is admixed with hydrogen gas and reduced into silicon at a high temperature. At this stage, hydrogen chloride is simultaneously produced as a by-product. The resulting silicon grows on the silicon single crystal rod through chemical vapor deposition to give a silicon single crystal while the growing silicon single crystal is etched with the hydrogen chloride generated as the by-product. The formation of single crystals in general requires that the amount of silicon used for the crystal growth through the chemical vapor deposition is always greater than that removed by the etching with the hydrogen chloride gas simultaneously generated as the by-product.

The silicon single crystal rod 1 is positioned in a growth chamber in the form of an up-side-down U-shaped rod having a diameter of the order of 4 mm as seen from FIG. 1. In the holding structure of the crystal rod shown in FIG. 1, the ratio of the longitudinal length a to the lateral length b of the rod is very important from the fluid mechanics of the gas flow, for improving the effects of the foregoing etching and chemical vapor deposition. The ratio: a/b preferably ranges from 3:1 to 12:1. The cross sectional shape of the silicon single crystal seed rod is not restricted to any particular one and the cross section may thus have a circular, square or rectangular shape.

When the silicon single crystal obtained according to the foregoing chemical vapor deposition method under the aforementioned conditions is irradiated with laser rays so that the energy on the irradiated surface of the crystal ranges from 3100 to 3358 mW/cm$^2$, the crystal emits spectra having a good S/N ratio. In this respect, the silicon single crystal thus produced has crystal defects and, therefore, the crystal emits only spectra having a low S/N ratio if it is irradiated with laser rays of a low energy, thus making the fractional determination of ultratrace elements impossible. Upon irradiating the crystal with light in liquid nitrogen (4° k.), a silicon atom acquires an energy greater than the transition energy (band gap) between the valence band and the conduction band of silicon to thus form free excitons and the free excitons are again coupled with constrained excitons which are captured by ultratrace elements to thus emit light. The quantitative determination of ultratrace elements is accordingly performed by determining the intensity of the emission spectra. The system for quantitative determination is calibrated by the use of a standard material containing ultratrace elements at known concentrations prior to the practical quantitative determination. When a silicon single crystal having crystal defects is irradiated with laser rays of a low energy, the foregoing constrained excitons undergo a non-light emission process in which they give energy to local strains accompanied by the crystal defects and dislocation defects and for this reason, the crystal does not emit satisfactory spectra.

Under such circumstances, the crystal is irradiated with laser rays having a higher intensity to enhance the recombination and transition efficiency of the constrained exciton. As a result, spectra having a slightly high S/N ratio could be obtained. The inventors of this invention have conducted detailed investigation of various factors such as spectrometric factors and responsibility of a detector for further improvement in the S/N ratio and thus the inventors could further improve the S/N ratio and obtain satisfactory spectra. Accordingly, the quantitative determination of the ultratrace elements is practicable. The laser source to be used is preferably an argon laser. The laser irradiation power at a wavelength of 5145 Å ranges from 600 to 650 mW (the optical path length extending from the laser source to the sample surface is 1.3 m). The slit widths at the inlet and outlet of a spectroscope (a condenser system comprises 8 group parts of 8 aspherical lenses and a grating structure has a density of 1200 lines/mm) range from 600 to 700 μm and the wavelength-feed rate of the spectroscope ranges from 0.5 to 0.7Å/sec. A photomultiplier is used as a detector and the time constant of the photomultiplier ranges from 3 to 4 sec.

The present invention will hereinafter be described in more detail with reference to the following Examples, but the present invention is by no means limited to these specific Examples.

EXAMPLE 1

A silicon single crystal seed rod was used as a solid phase and, in the holding structure thereof (see FIG. 1), the ratio: a/b was set to 6. A mixture of trichlorosilane and hydrogen gas was used as a starting gas. The amount of trichlorosilane was 9.0 mole % on the basis of the total amount of the starting gas mixture. The flow rate of the starting gas mixture and the temperature thereof were set to 960 l/hr and 1200° C. respectively and a silicon single crystal was grown through the chemical vapor deposition under these conditions. The resulting silicon single crystal was irradiated with laser rays under the conditions listed in the following Table 1 and the spectra emitted were photoelectrically detected to perform fractional determination of ultratrace elements present in the single crystal. The results (S/N ratios) obtained are summarized in Table 1. Moreover, the results are shown in FIG. 2 as a spectral chart. The concentrations of the ultratrace elements are listed in the following Table 2.

COMPARATIVE EXAMPLE 1

A silicon polycrystal was grown on a seed rod of a silicon polycrystal as a solid phase through the chemical vapor deposition. More specifically, trichlorosilane as a starting material was heated together with hydrogen gas to reduce trichlorosilane and to thus form silicon which was deposited on the seed rod to grow a silicon polycrystal. A part of the resulting silicon polycrystal was sampled and converted into a silicon single crystal according to the floating zone melting method. After determining the specific resistance of the resulting silicon single crystal, the floating zone melting procedures were repeated several times under vacuum to remove donors (phosphorus and arsenic) and the specific resistance was again determined to calculate the total concentration of the remaining acceptors (boron and aluminum). The concentration of the sum of phosphorus and arsenic was calculated on the basis of the total concentration of the acceptors and the difference between the specific resistances determined above. The results thus obtained are listed in Table 2.

In Table 2, the concentrations are expressed in terms of ppta (part per trillion atomic) and reduced to respective specific resistances according to the folowing following relation.

Resistance =1000 ×93/{[P+As(ppta)]−[B+Al(ppta)]}

Resistance of the silicon single crystal produced in Example 1

=1000×93/{[104+2]−[21+2]}=1120(Ω· cm)

Resistance of the silicon single crystal produced in Comparative Example 1

=1000×93/{[170]−[38]}=704(Ω· cm)

The resistances practically determined are likewise listed in Table 2. The data listed in Table 2 clearly indicate that the resistance obtained from the concentration determined in Example 1 is closer to that practically determined, as compared with that obtained from the concentration determined in Comparative Example 1.

COMPARATIVE EXAMPLE 2

A silicon single crystal was produced in the same manner used in Example 1. The resulting silicon single crystal was irradiated with laser rays under the conditions listed in the following Table 1 and the spectra emitted were photoelectrically detected to perform fractional determination of ultratrace elements present in the single crystal. The results (S/N ratios) obtained are summarized in Table 1. Moreover, the results are shown in FIG. 2 as a spectral chart.

TABLE 1

| Determination with Laser Rays | | |
|---|---|---|
|  | Ex. 1 | Comp. Ex. 2 |
| Wavelength of Laser for Excitation | 5145 Å | 5145 Å |
| Irradiation Power of Laser for Excitation | 600 mW | 300 mW |
| Slit Width of Inlet Outlet of Spectroscope | 600 μm | 300 μm |
| Spectroscope Wavelength Feed Step | 0.5 Å/s | 3 Å/s |
| Time Constant of Spectroscope | 3 sec | 1 sec |
| S/N Ratio of P | 27 | 2.5 |
| S/N Ratio of As | 3 | 1 |
| S/N Ratio of B | 8 | 1 |

TABLE 2

| Determination of the amount of ultratrace elements present in silicon single crystal obtained from trichlorosilane | | | | | | |
|---|---|---|---|---|---|---|
| Ultratrace Elements | Example 1 | | | | Comp. Ex. 1 | |
| (ppta) | P | As | B | Al | P + As | B + Al |
| Determination, 1st time | 100 | <2 | 18 | <2 | 120 | 20 |
| Determination, 2nd time | 90 | <2 | 20 | <2 | 60 | 8 |
| Determination, 3rd time | 110 | <2 | 20 | <2 | 250 | 50 |
| Determination, 4th time | 120 | <2 | 23 | <2 | 110 | 20 |
| Determination, 5th time | 100 | <2 | 25 | <2 | 300 | 90 |
| Average of 5 measurements | 104 | <2 | 21 | <2 | 170 | 38 |
| Variation Coefficient | 11% | 0 | 13% | 0 | 61% | 88% |
| *Reduced Resistance (Ω · cm) | 1100 | | | | 700 | |
| Resistance Found (Ω · cm) | 1050 | | | | 1050 | |

As seen from Table 2, the lower limit of determination in Comparative Example 1 is 20 ppta and the resulting concentration is that of the sum of phosphorus and arsenic, or boron and aluminum. On the other hand, the lower limit of determination in the method of the present invention is 2 ppta and the concentration of each individual ultratrace element can be evaluated. This greatly contributes to the control of the production process of chlorosilanes and of the growth process of silicon single crystals.

As has been described above in detail, the method for producing silicon single crystals for semiconductors according to the present invention makes it possible to directly produce silicon single crystals through the chemical vapor deposition technique without using the floating zone melting method. Therefore, the resulting single crystal is not contaminated by a floating zone melting apparatus per se and has a high purity. Moreover, the operation time can markedly be reduced because of the elimination of the floating zone melting process which requires complicated operations and demands skill in the operator.

In addition, the method for the fractional determination of ultratrace elements present in the silicon single crystal produced or chlorosilanes used as starting materials makes it possible to determine each element to an accuracy of the order of ppta and to likewise determine ultratrace elements present in silicon crystals having crystal defects.

To obtain desired electrical properties of a semiconductor, ultratrace elements such as phosphorus, arsenic, boron and aluminum are optionally added, as dopants, to chlorosilanes as starting material for producing the semiconductor. In this respect, the method for the fractional determination of ultratrace elements according to the present invention makes it possible to precisely determine the amounts of the dopants to be added since the method allows the determination of the amounts of these existing elements accurately.

What is claimed is:

1. A method for fractional determination of ultratrace elements present in a silicon single crystal comprising the steps of irradiating a silicon single crystal produced according to chemical vapor deposition with laser rays so that the energy of the laser rays on the irradiated surface of the crystal ranges from 3100 to 3358 mW/cm$^2$ and then opto-electrically determining spectra emitted by the crystal to thus quantify the ultratrace elements present in the silicon single crystal.

2. The method of claim 1 for fractional determination of ultratrace elements present in a silicon single crystal wherein the laser rays are from an argon laser.

* * * * *